(12) United States Patent  
Kuhara et al.

(10) Patent No.: US 7,366,367 B2
(45) Date of Patent: Apr. 29, 2008

(54) OPTICAL DATA LINK AND METHOD OF MANUFACTURING OPTICAL DATA LINK

(75) Inventors: Yoshiki Kuhara, Osaka (JP); Mitsuaki Nishie, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 484 days.

(21) Appl. No.: 10/848,345

(22) Filed: May 17, 2004

(65) Prior Publication Data

US 2005/0157972 A1 Jul. 21, 2005

(30) Foreign Application Priority Data

May 21, 2003 (JP) ............................. 2003-143996

(51) Int. Cl.
*G02B 6/30* (2006.01)
*G02B 6/42* (2006.01)

(52) U.S. Cl. ............................. 385/14; 385/49; 385/88; 385/89

(58) Field of Classification Search ...................... None
See application file for complete search history.

(56) References Cited

U.S. PATENT DOCUMENTS 5,835,646 A * 11/1998 Yoshimura et al. ........... 385/14
6,115,515 A * 9/2000 Itoh et al. ..................... 385/14
7,136,594 B2 * 11/2006 Nakanishi et al. .......... 398/164
2001/0024553 A1 * 9/2001 Nakanishi et al. ............ 385/94
2002/0168152 A1 * 11/2002 Abe et al. ..................... 385/88

FOREIGN PATENT DOCUMENTS

| JP | 08037500 | 2/1996 |
| JP | 11196055 | 7/1999 |
| JP | 2000-345506 | 12/2001 |
| JP | 2002082261 | 3/2002 |
| JP | 2003-31755 | 1/2003 |

* cited by examiner

*Primary Examiner*—Tina M. Wong
(74) *Attorney, Agent, or Firm*—Fish & Richardson P.C.

(57) ABSTRACT

An optical data link includes a circuit board and an optical module component. The circuit board includes first and second mounting sections on a principal plane thereof. A step is formed between the first mounting section and the second mounting section. The first mounting section has the optical module component, and the second mounting section has an electron device. The optical module component includes a mounting component, a semiconductor optical device, and an optical transmission medium. The semiconductor optical device of the optical module component is electrically connected to the electron device, and is mounted on a first region of the mounting component. The optical transmission medium is supported by a second region of the mounting component, and is optically coupled with the semiconductor optical device.

12 Claims, 12 Drawing Sheets

OPTICAL DATA LINK AND METHOD OF MANUFACTURING OPTICAL DATA LINK

BACKGROUND OF THE INVENTION

1. Field of the Invention

The present invention relates to an optical data link, and a method of manufacturing the optical data link.

2. Description of the Related Art

An optical data link of the related art is an optical transmitter and receiver shown in, for example, Japanese Unexamined Patent Application Publication No. 2002-82261. A housing for the optical transmitter and receiver includes optical receptacle housing and a storage unit for storing an electronic circuit card. The optical receptacle housing has a concave portion for positioning an optical receiver module and an optical transmission module. The storage unit includes a supporting portion. The supporting portion prevents backward movement of the optical receiver module and the optical transmission module.

Another optical transmitter and receiver is shown in Japanese Unexamined Patent Application Publication No. 8-37500. An optical transmitting circuit board and an optical receiving circuit board are housed in a housing. The optical transmitting circuit board and the optical receiving circuit board are connected to an optical transmission module and an optical receiver module, respectively, which are attached to the housing. The optical receiver module and the optical transmission module individually include CAN type packages. These packages have lead terminals for the respective circuit boards. In this optical transmitter and receiver, the housing is divided into two parts. The optical transmitting circuit board, which is housed on the bottom of one of the housing parts, is connected to the lead terminals of the optical transmission module. The optical receiving circuit board, which is housed on the bottom of the other housing part, is connected to the lead terminals of the optical receiver module.

Still another optical transmitter and receiver is shown in Japanese Unexamined Patent Application Publication No. 11-196055. In this optical transmitter and receiver, lead terminals of each of an optical receiver module and an optical transmission module are electrically connected to signal wiring on a flexible substrate. Each flexible substrate includes a flexible insulating layer and a ground layer along the edge of the insulating layer. The ground layer is connected to an earth layer, thus providing an electromagnetic shield around a connecting unit connected to each lead terminal.

However, such optical transmitters and receivers have a complex structure, and require a large number of component parts. For example, in the optical transmitter and receiver shown in Japanese Unexamined Patent Application Publication No. 2002-82261, an optical receiver module and an optical transmission module individually includes CAN type packages. The optical receiver module and the optical transmission module are housed in a housing. Lead terminals of the optical receiver module and the optical transmission module are connected to an electronic circuit card. In the optical transmitter and receiver shown in Japanese Unexamined Patent Application Publication No. 8-37500, an optical receiver module and an optical transmission module individually include CAN type packages. The optical receiver module and the optical transmission module are connected to an optical receiving circuit and an optical transmitting circuit, respectively. The optical transmitting circuit and the optical receiving circuit are housed in a single housing. In the optical transmitter and receiver shown in Japanese Unexamined Patent Application Publication No. 11-196055, an optical receiver module and an optical transmission module individually include CAN type packages. The optical receiver module and the optical transmission module are connected to a circuit board via lead terminals, respectively.

SUMMARY OF THE INVENTION

Accordingly, it is an object of the present invention to provide an optical data link with fewer component parts.

In an aspect of the present invention, an optical data link includes (a) a circuit board having first and second mounting sections on a principal plane thereof, (b) an optical module component mounted on the first mounting section of the circuit board, and (c) an electron device mounted on the second mounting section of the circuit board. A step is formed between the first mounting section and the second mounting section. The optical module component includes (d) a mounting component having a principal plane including first and second regions, (e) a semiconductor optical device electrically connected to the electron device and mounted on the first region of the mounting component, and (f) an optical transmission medium supported by the second region of the mounting component and optically coupled with the semiconductor optical device.

Thus, the optical data link is structured such that the optical transmission medium and the semiconductor optical device are optically coupled together on the mounting component of the optical module component. The semiconductor optical device on the mounting component is electrically connected to the electron device on the circuit board. In the optical data link according to the present invention, a step may be formed on the circuit board between the first mounting section and the second mounting section. The optical module component is positioned by the step.

In the optical data link according to the present invention, the optical transmission medium may include an optical fiber and a ferrule. The optical fiber may have first and second portions, and the second portion of the optical fiber may be retained in the ferrule.

In the optical data link, the optical fiber can be easily handled since it is retained in the ferrule.

In the optical data link according to the present invention, the mounting component may have a first supporting groove for supporting the first portion of the optical fiber, and a second supporting groove for supporting the ferrule, and the optical fiber may be positioned on the mounting component so as to be optically coupled with the semiconductor optical device.

In the optical data link, therefore, the grooves in the mounting component can be used to position the optical fiber.

In the optical data link according to the present invention, the mounting component may have a supporting groove for supporting the first portion of the optical fiber, and the circuit board may have a supporting groove for supporting the ferrule. The optical fiber may be positioned on the mounting component so as to be optically coupled with the semiconductor optical device.

In the optical data link, therefore, the grooves can be used to position the optical fiber.

In the optical data link according to the present invention, the semiconductor optical device may be a photodiode or a semiconductor laser.

Therefore, the optical data link having the structure described above can be applied to any one of a photodiode and a semiconductor laser.

The optical data link according to the present invention may further include (g) a second semiconductor optical device mounted on the first region of the mounting component, and (h) a second optical transmission medium mounted on the second region of the mounting component and optically coupled with the second semiconductor optical device. A second electron device may be mounted on the circuit board, and the second semiconductor optical device may be electrically connected to the second electron device.

In the optical data link, therefore, the mounting component has a plurality of semiconductor optical devices, and the semiconductor optical devices are optically coupled with the optical transmission media on the mounting component, respectively.

The optical data link according to the present invention may further include a receptacle member having a receptacle structure. The receptacle member may be attached to at least one of the optical module component and the mounting component.

Therefore, an optical data link having a receptacle structure is provided.

The optical data link according to the present invention may further include a transparent resin formed on an optical path from one of the semiconductor optical device and the optical transmission medium to the other, and light propagating through the optical transmission medium may be allowed to pass through the transparent resin.

In the optical data link, therefore, the optical path from one of the semiconductor optical device and the optical transmission medium to the other is contained in the transparent resin. The transparent resin can prevent a substance from obstructing the optical path.

In the optical data link according to the present invention, the principal plane of the mounting component and the principal plane of the circuit board may extend along a predetermined reference plane.

Therefore, the optical data link reduces the electrical wiring length between the semiconductor optical device and the circuit board.

In another aspect, the present invention provides a method of manufacturing an optical data link. This method includes the steps of (a) optically axially aligning an optical fiber and a semiconductor optical device on a mounting component to form an optical module component, (b) mounting the optical module component and an electron device onto a circuit board, and (c) connecting the optical module component and the electron device to a conductive pattern formed on the circuit board.

According to this method, therefore, optical axial alignment between the optical fiber and the semiconductor optical device can be implemented with the use of the mounting component. After the optical module component and the electron device are mounted on the circuit board, the semiconductor optical device then can be electrically connected to the electron device. This allows the electron device and the optical module component to be mounted onto the circuit board in a similar manner.

In the method of the present invention, the optical module component may be mounted onto a concave portion in the circuit board.

In this method, therefore, the electrical wiring length between the semiconductor optical device and the circuit board can be reduced.

As described above, according to the present invention, an optical data link having fewer component parts is provided.

The above-described object and other objects, features, and advantages of the present invention will become readily apparent from the following detailed description of the preferred embodiments of the present invention taken with reference to the accompanying drawings.

DESCRIPTION OF THE PREFERRED EMBODIMENTS

Figure 1:
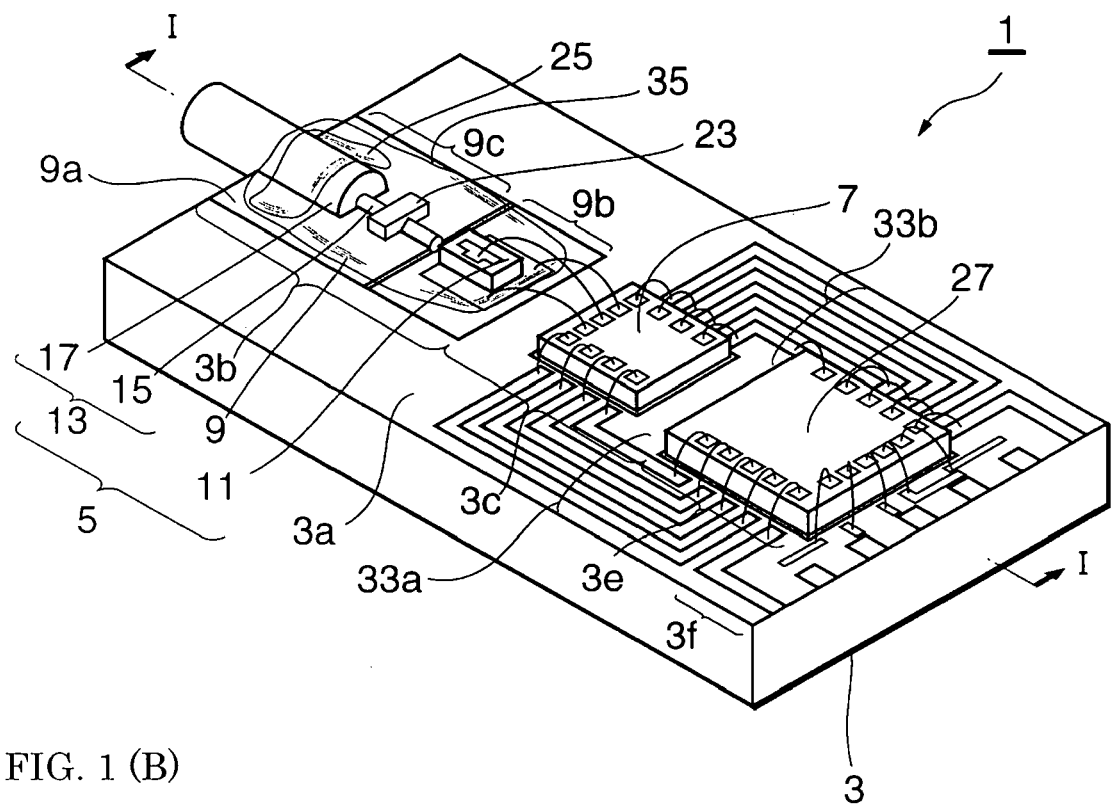
FIG. 1A is a schematic view of an optical data link according to a first embodiment of the present invention.
FIG. 1B is a cross-sectional view of the optical data link, taken along a line I-I in FIG. 1A.
Figure 1:
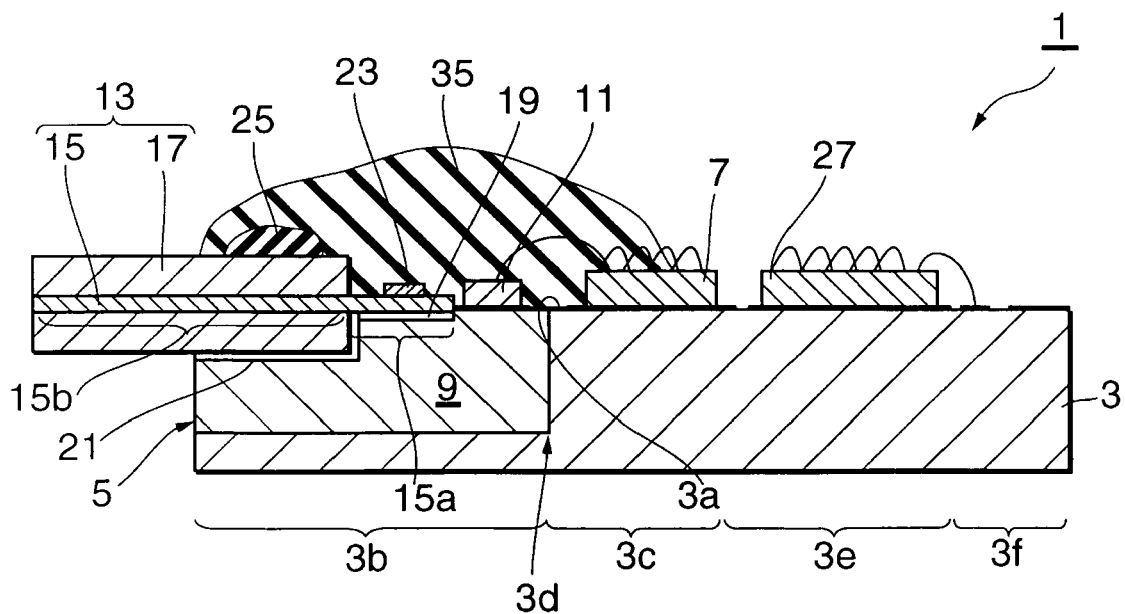

The features of the present invention will be readily understood from the following detailed description when read in connection with the accompanying drawings. An optical data link and a method of manufacturing the optical data link according to embodiments of the present invention will now be described, by way of example, with reference to the drawings. The same parts are assigned the same reference numerals, where appropriate.

First Embodiment

Figure 2:
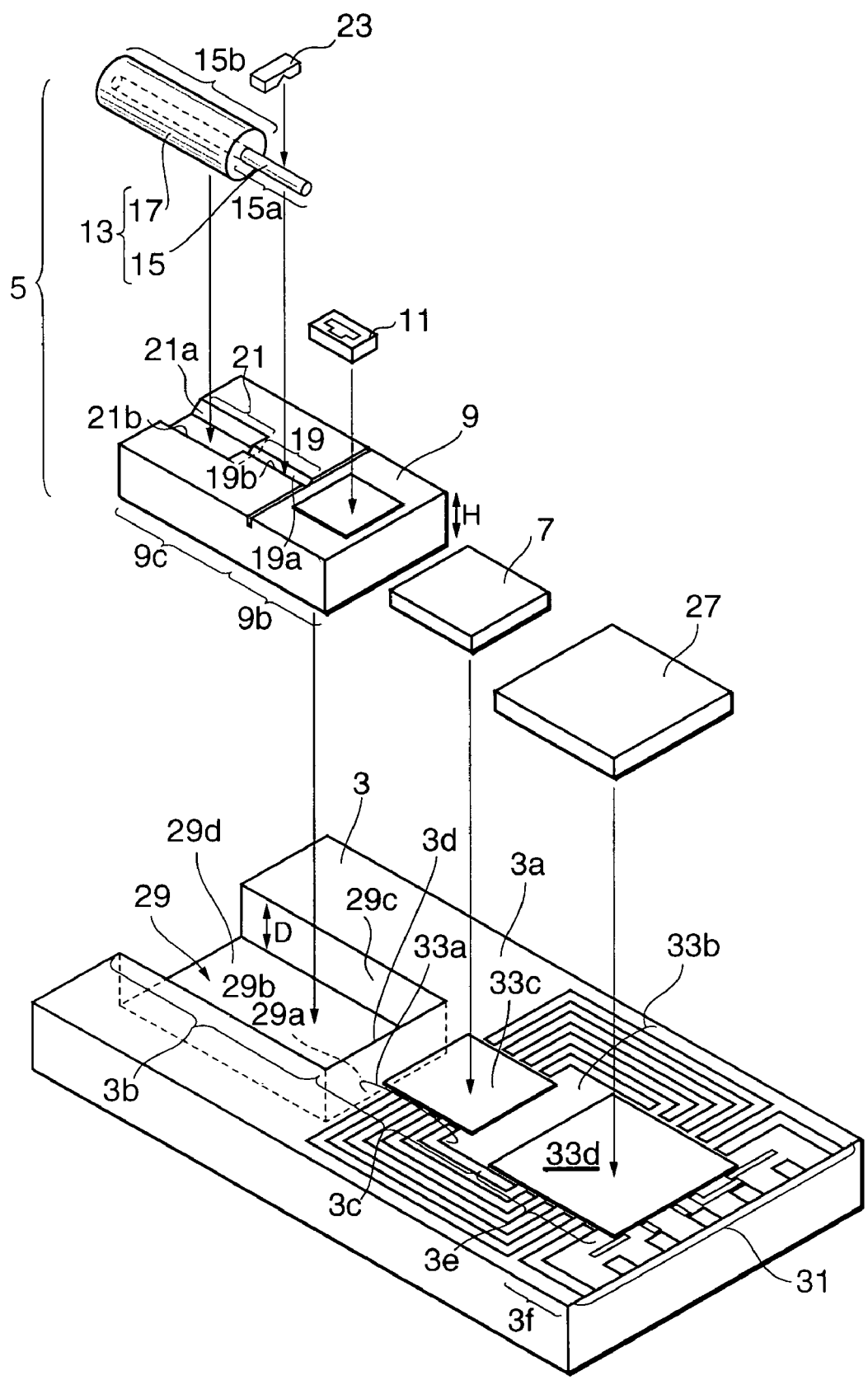
FIG. 2 is a schematic view of component parts of the optical data link shown in FIG. 1A.

FIG. 1A is a schematic view of an optical data link 1 according to a first embodiment of the present invention. FIG. 1B is a cross-sectional view of the optical data link 1, taken along a line I-I in FIG. 1A. FIG. 2 is a schematic view of component parts of the optical data link 1 shown in FIG. 1A.

Referring to FIGS. 1A, 1B, and 2, the optical data link 1 includes a circuit board 3 and an optical module component 5. The circuit board 3 has a principal plane 3a, and first and second mounting sections 3b and 3c disposed on the principal plane 3a. The principal plane 3a extends along a first reference plane. A step 3d is formed between the first mounting section 3b and the second mounting section 3c. The first mounting section 3b has the optical module component 5. The second mounting section 3c has an electron device 7. The optical module component 5 includes a mounting component 9, a semiconductor optical device 11, and an optical transmission medium 13. In the optical module component 5, the mounting component 9 has a principal plane 9a, including a first region 9b and a second region 9c. The semiconductor optical device 11 is electrically connected to the electron device 7, and is mounted on the first region 9b of the mounting component 9. The optical transmission medium 13 is supported by the second region 9c of the mounting component 9, and is optically coupled with the semiconductor optical device 11.

In the optical data link 1, the optical transmission medium 13 and the semiconductor optical device 11 are optically coupled with each other on the mounting component 9. The semiconductor optical device 11 on the mounting component 9 is electrically connected to the electron device 7 on the circuit board 3.

In the optical data link 1, the optical transmission medium 13 includes an optical fiber 15 and a ferrule 17. The optical fiber 15 has a first portion 15a and a second portion 15b. The second portion 15b of the optical fiber 15 is retained in the ferrule 17. In the optical data link 1, the optical fiber 15 is retained in the ferrule 17, and is thus easily handled.

The mounting component 9 has a first supporting groove 19 and a second supporting groove 21. The first supporting groove 19 supports the first portion 15a of the optical fiber 15. In the mounting component 9 as shown in FIG. 2, the first supporting groove 19 has a first face 19a and a second face 19b, by both of which the optical fiber 15 is supported at its side portions. The second supporting groove 21 supports the ferrule 17. In the mounting component 9 as shown in FIG. 2, the second supporting groove 21 has a first face 21a and a second face 21b, by both of which the ferrule 17 is supported at its side portions. The optical fiber 15 is positioned on the mounting component 9 so as to be optically coupled with the semiconductor optical device 11. In the first embodiment, the optical fiber 15 is fixed to the mounting component 9 using a fixing member 23, and the ferrule 17 is fixed to the mounting component 9 using an adhesive 25.

In the optical data link 1, the grooves 19 and 21 in the mounting component 9 are used to position the optical fiber 15. For example, the mounting component 9 may be made of a silicon semiconductor, and the first and second supporting grooves 19 and 21 in the mounting component 9 may be V-shaped or trapezoidal grooves formed by etching a silicon substrate.

The circuit board 3 may further include a third mounting section 3e. The optical data link 1 further includes an electron device 27. The electron device 27 is mounted on the third mounting section 3e of the circuit board 3. In the first embodiment, the first, second, and third mounting sections 3b, 3c, and 3e are arranged in a predetermined axial direction.

The circuit board 3 may further include an interface part 3f. The interface part 3f has one or a plurality of electrodes 31 for connecting the circuit board 3 to an external device(s).

In the optical data link 1, the step 3d is formed between the first mounting section 3b and the second mounting section 3c on the circuit board 3. The first mounting section 3b has a positioning face 29a for positioning the mounting component 9. The positioning face 29a extends along a second reference plane orthogonal to the first reference plane. The first mounting section 3b has guiding faces 29b and 29c for guiding the mounting component 9. The guiding faces 29b and 29c extend along a third reference plane orthogonal to the first reference plane. The first mounting section 3b has a bottom face 29d for supporting the mounting component 9. The bottom face 29d extends along a fourth reference plane, and the spacing between the first reference plane and the fourth reference plane is represented by symbol D in FIG. 2. In the first embodiment, the step 3d is formed of a concave portion 29. The concave portion 29 may be, for example, a groove that extends from one side of the mounting component 9.

The circuit board 3 has conductive patterns 33a and 33b on the principal plane 3a. The conductive patterns 33a and 33b are used for electrical connection between the electron devices 7 and 27. The second mounting section 3c has a conductive pattern 33c for mounting the electron device 7, and the third mounting section 3d has a conductive pattern 33d for mounting the electron device 27. The electron devices 7 and 27 are connected to the conductive patterns 33a and 33b via a connector such as a bonding wire. The semiconductor optical device 11 is electrically connected to the electron device 7 via a connector such as a bonding wire.

In the optical data link 1, the semiconductor optical device 11 may be either a photodiode or a semiconductor laser. If the semiconductor optical device 11 is a photodiode, the electron device 7 may be an amplifier that receives a signal from this photodiode. The electron device 27 may be a signal processing device for processing the signal from the amplifier. If the semiconductor optical device 11 is a semiconductor laser, the electron device 7 may be a driving element for driving the semiconductor laser. The electron device 27 may be a signal processing device for processing a signal to be sent to the driving element.

The optical data link 1 may further include a transparent resin 35, which is formed over the optical path from one to the other of the semiconductor optical device 11 and the optical transmission medium 13. The light propagating through the optical transmission medium 13 is allowed to pass through the transparent resin 35. The optical path from one of the semiconductor optical device 11 and the optical transmission medium 13 to the other is contained in the transparent resin 35, which can prevent a substance, such as a foreign object, from obstructing the optical path.

In the optical data link 1, the principal plane 9a of the mounting component 9 and the principal plane 3a of the circuit board 3 may extend along a common reference plane. In such structure of the optical data link 1, the electrical wiring length between the semiconductor optical device 11 and the circuit board 3 can be reduced. In the first embodiment, the first mounting section 3b has a depth D, and the mounting component 9 has a height H. In a preferred form, the value D substantially equals the value H.

Figure 3:
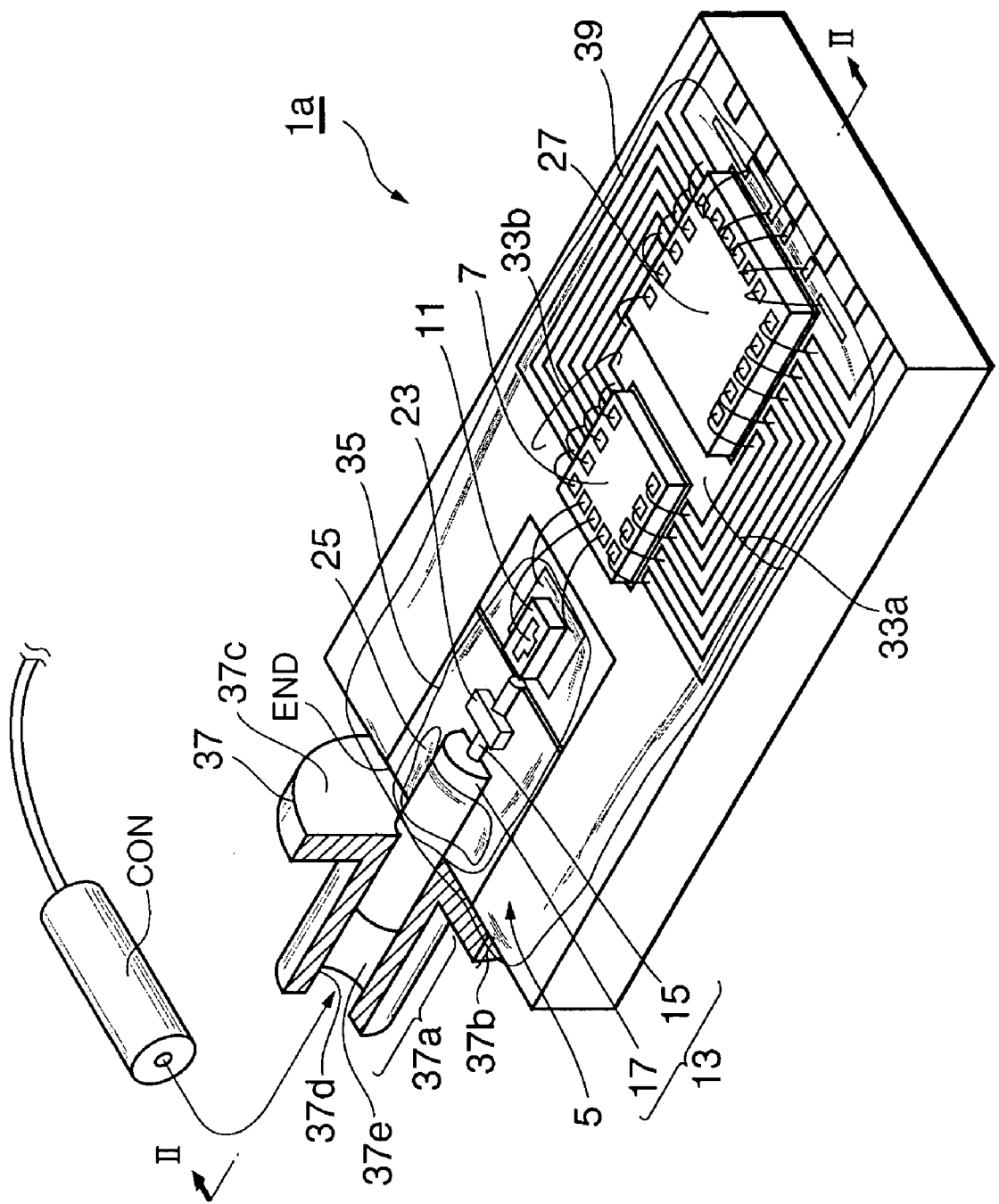
FIG. 3 is a schematic view of an optical data link according to a modification of the first embodiment.
Figure 4:
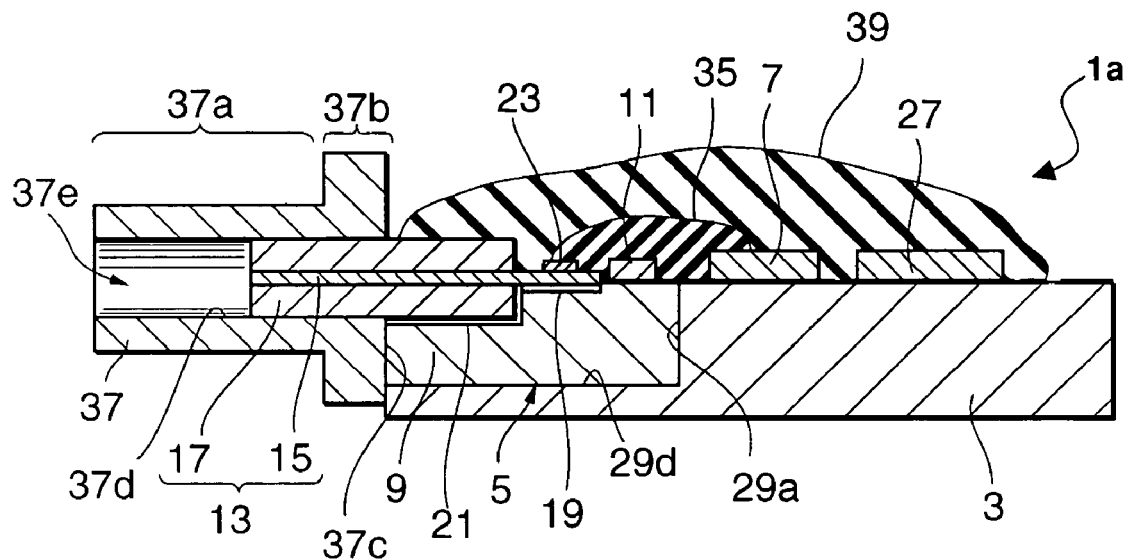
FIG. 4A is a cross-sectional view of the optical data link, taken along a line II-II in FIG. 3.
FIG. 4B is a plan view of the optical data link shown in FIG. 3.
Figure 4:
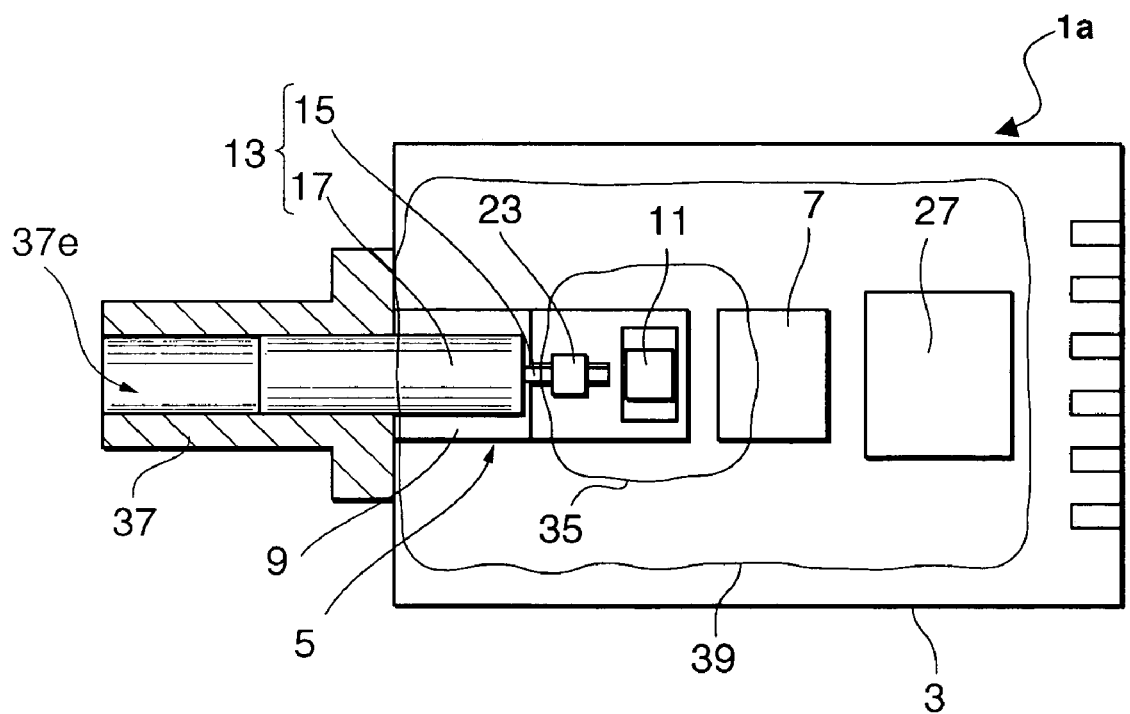

FIG. 3 is a schematic view of an optical data link 1a according to a modification of the first embodiment. FIG. 4A is a cross-sectional view of the optical data link 1a, taken along a line II-II in FIG. 3, and FIG. 4B is a plan view of the optical data link 1a shown in FIG. 3. The optical data link 1a may further include a receptacle member 37 having a receptacle structure. The receptacle member 37 is attached to at least one of the optical module component 5 and the mounting component 9. The receptacle member 37 has a sidewall portion 37a and an attachment portion 37b that are arranged in a predetermined direction. The attachment portion 37b has a sliding face 37c. The receptacle member 37 further has a side face 37d extending in a predetermined axial direction, and a receptacle hole 37e defined by the side face 37d. A portion of the receptacle hole 37e receives a portion of the ferrule 17, and the remaining portion of the receptacle hole 37e can receive another ferrule CON. The sliding face 37c of the receptacle member 37 abuts against an end face END of at least one of the optical module component 5 and the mounting component 9.

The optical data link 1a may further include a sealing resin 39 with which the transparent resin 35, the semiconductor optical device 11, and the electron devices 7 and 27 are covered. The sealing resin 39 may be formed over the principal plane 3a of the circuit board 3 so as to protect the semiconductor optical device 11 and the electron devices 7 and 27 from contamination.

Moreover, in the optical module component 5 of the optical data link 1a, the semiconductor optical device 11 is optically coupled with the optical transmission medium 13. The optical module component 5 is mounted on the circuit board 3. Therefore, the optical data link 1a does not require a CAN type package for accommodating the semiconductor optical device 11. The optical data link 1a also has a structure that allows for a reduction in the distance between the semiconductor optical device 11 and the electron device 7. Since the optical module component 5 and the electron device 7 are mounted on a single circuit board, fewer assembly process steps are required to produce the optical data link 1a. Therefore, the cost of the parts and the manufacturing cost of the optical data link 1a can be reduced.

As described above, in the optical data link 1a of the modification of the first embodiment, the optical module component 5 includes optical coupling between the optical transmission medium 13 and the semiconductor optical device 11 using the mounting component 9, and the optical module component 5 is mounted on the circuit board 3. Therefore, the optical data link 1a requires fewer component parts.

Second Embodiment

Figure 5:
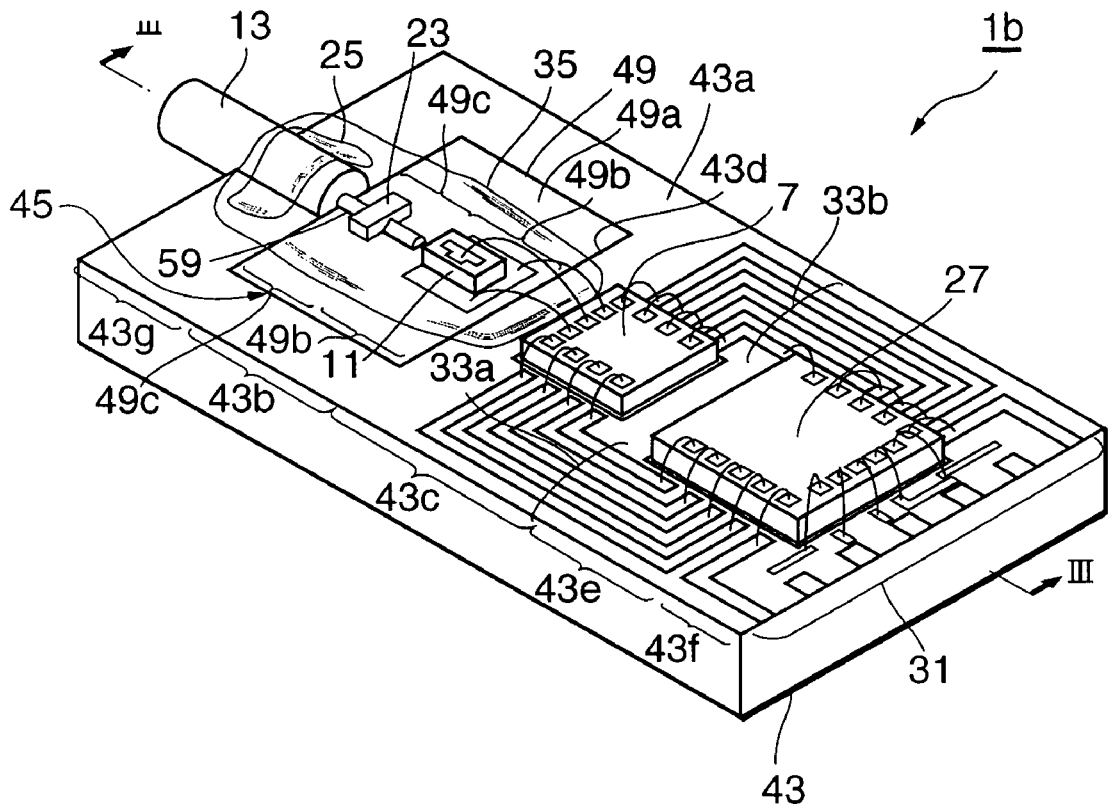
FIG. 5A is a schematic view of an optical data link according to a second embodiment of the present invention.
FIG. 5B is a cross-sectional view of the optical data link, taken along a line III-III in FIG. 5A.
Figure 5:
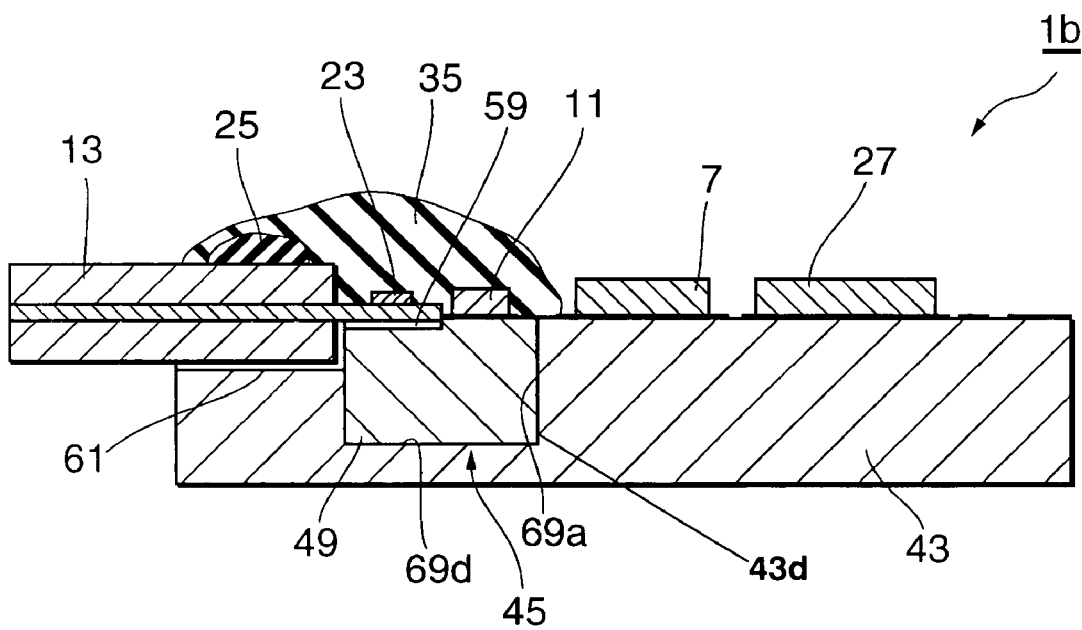
Figure 6:
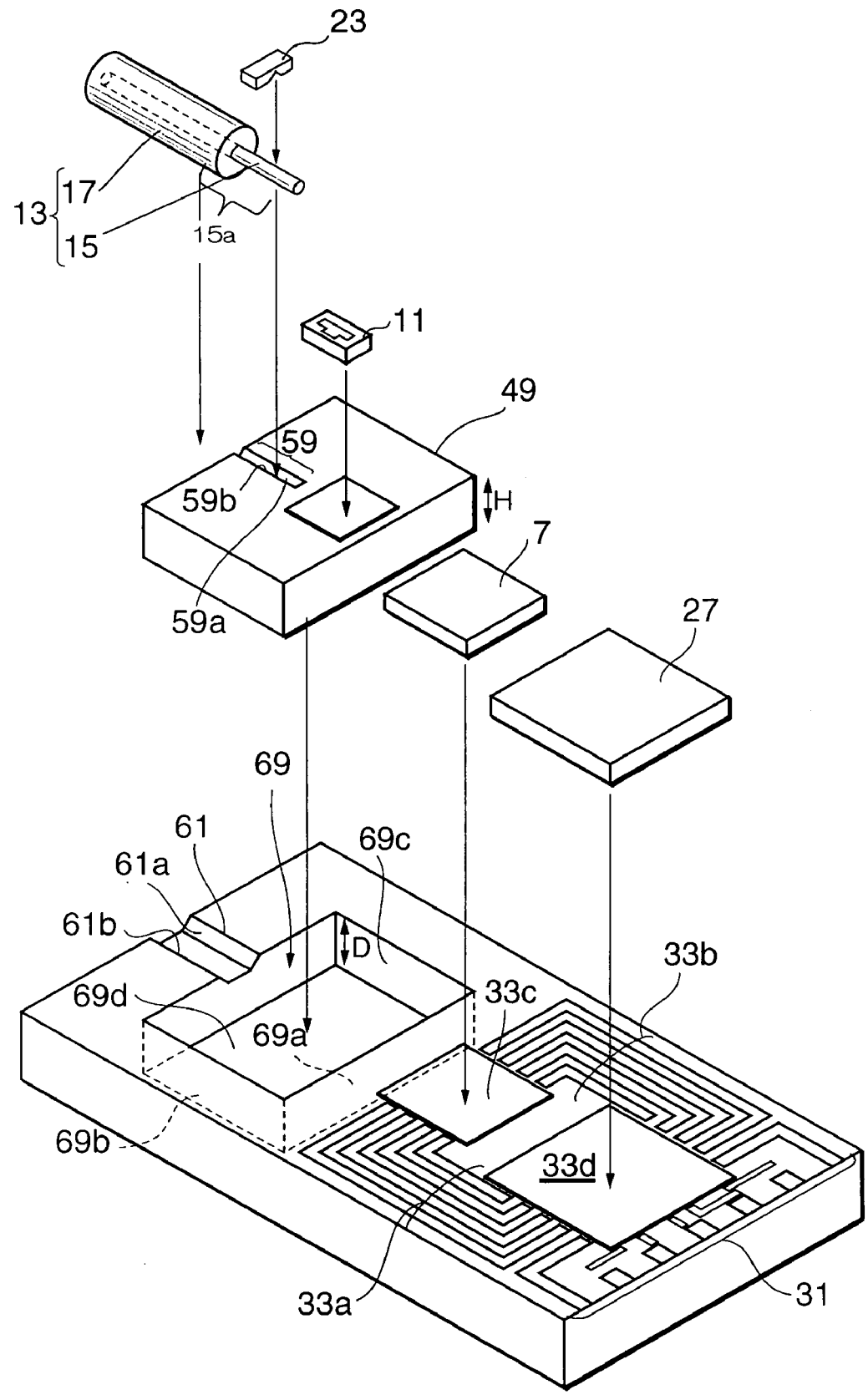
FIG. 6 is a schematic view of component parts of the optical data link shown in FIG. 5A.

FIG. 5A is a schematic view of an optical data link 1b according to a second embodiment of the present invention. FIG. 5B is a cross-sectional view of the optical data link 1b, taken along a line III-III in FIG. 5A. FIG. 6 is a schematic view of component parts of the optical data link 1b shown in FIG. 5A.

Referring to FIGS. 5A, 5B, and 6, the optical data link 1b includes a circuit board 43 and an optical module component 45. The circuit board 43 has a principal plane 43a, and first and second mounting sections 43b and 43c disposed on the principal plane 43a. The principal plane 43a extends along a first reference plane. A step 43d is formed between the first mounting section 43b and the second mounting section 43c. The first mounting section 43b has the optical module component 45. The second mounting section 43c has an electron device 7. The optical module component 45 includes a mounting component 49, a semiconductor optical device 11, and an optical transmission medium 13. In the optical module component 45, the mounting component 49 has a principal plane 49a, including a first region 49b and a second region 49c. The semiconductor optical device 11 is electrically connected to the electron device 7, and is mounted on the first region 49b of the mounting component 49. The optical transmission medium 13 is supported by the second region 49c of the mounting component 49, and is optically coupled with the semiconductor optical device 11.

In the optical data link 1b, the optical transmission medium 13 and the semiconductor optical device 11 are optically coupled with each other on the mounting component 49. The semiconductor optical device 11 on the mounting component 49 is electrically connected to the electron device 7 on the circuit board 43.

In the optical data link 1b, the mounting component 49 has a supporting groove 59 in the first region 49c. The supporting groove 59 supports a first portion 15a of an optical fiber 15. In the mounting component 49 as shown in FIG. 6, the first supporting groove 59 has a first face 59a and a second face 59b, by both of which the optical fiber 15 is supported at its side portions.

The circuit board 43 further includes a supporting portion 43g. The supporting portion 43g has a supporting groove 61 for supporting a ferrule 17. The optical fiber 15 is positioned on the mounting component 49 so as to be optically coupled with the semiconductor optical device 11. The supporting groove 61 has a first face 61a and a second face 61b, by both of which the ferrule 17 is supported at its side portions. In the optical data link 1b, the grooves 59 and 61 are used for positioning of the optical fiber 15.

Also in the optical data link 1b of the second embodiment, for example, the mounting component 49 may be made of a silicon semiconductor. Also in the optical data link 1b, the semiconductor optical device 11 may be either a photodiode or a semiconductor laser.

The circuit board 43 may further include a third mounting section 43e. The optical data link 1b further includes an electron device 27, which is mounted on the third mounting section 43e of the circuit board 43. In the second embodiment, the supporting portion 43g and the first, second, and third mounting sections 43b, 43c, and 43e are arranged in a predetermined axial direction.

The circuit board 43 may further include an interface part 43f, which has one or a plurality of electrodes 31 for connecting the circuit board 43 to an external device(s).

In the optical data link 1b, the step 43d is formed between the first mounting section 43b and the second mounting section 43c on the circuit board 43. The first mounting section 43b has a positioning face 69a for positioning the mounting component 49. The positioning face 69a extends along a second reference plane orthogonal to the first reference plane. The first mounting section 43b has guiding faces 69b and 69c for guiding the mounting component 49. The guiding faces 69b and 69c extend along a third reference plane orthogonal to the first reference plane. When the optical module component 45 is mounted on the first mounting section 43b, the supporting groove 59 in the optical module component 45 and the supporting groove 61 in the circuit board 43 extend along a predetermined axis. The position of the guiding faces 69b and 69c is determined so that the grooves 59 and 61 are arranged in the manner described above.

The first mounting section 43b has a bottom face 69d for supporting the mounting component 49. The bottom face 69d extends along a fourth reference plane, and the distance between the first reference plane and the fourth reference plane is represented by symbol D in FIG. 6. In the second embodiment, the step 43d is formed of a concave portion 69.

The optical data link 1b may further include a transparent resin 35. The optical data link 1b may further include the receptacle member 37 shown in FIG. 4. The optical data link 1b may further include the sealing resin 39 shown in FIG. 4.

In the optical data link 1b, the principal plane 49a of the mounting component 49 and the principal plane 43a of the circuit board 43 may extend along a common reference plane. With such structure of the optical data link 1b, the electrical wiring length between the semiconductor optical device 11 and the circuit board 43 can be reduced. In the second embodiment, the first mounting section 43b has a depth D, and the mounting component 49 has a height H. In a preferred form, the value D substantially equals the value H.

As described above, in the optical data link 1b of the second embodiment, the optical module component 5 includes optical coupling between the optical transmission medium 13 and the semiconductor optical device 11 using the mounting component 49, and the optical module component 5 is mounted onto the circuit board 43. Therefore, the optical data link 1b requires fewer component parts.

Third Embodiment

Figure 7:
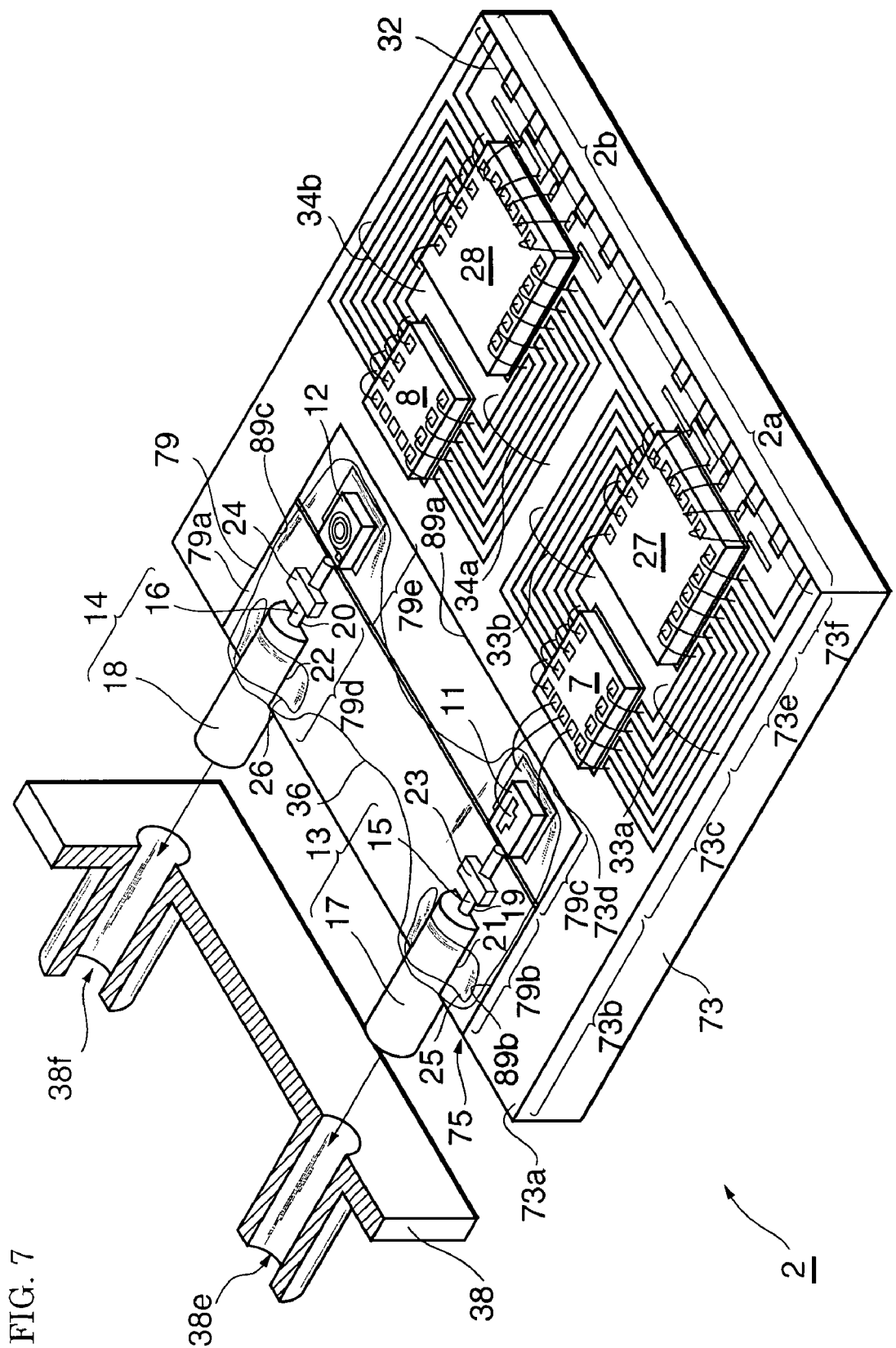
FIG. 7 is a schematic view of an optical data link according to a third embodiment of the present invention.
Figure 8:
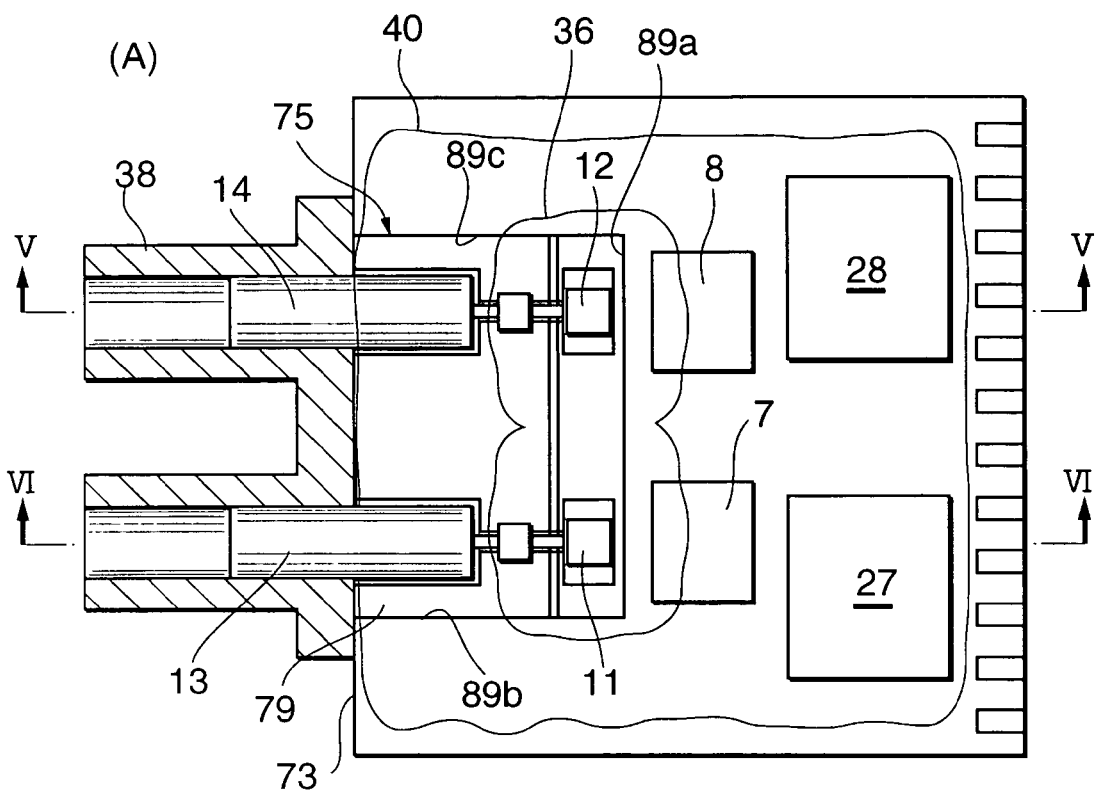
FIG. 8A is a plan view of the optical data link according to the third embodiment.
FIG. 8B is a cross-sectional view of the optical data link, taken along a line V-V in FIG. 8A.
FIG. 8C is a cross-sectional view of the optical data link, taken along a line VI-VI in FIG. 8A.
Figure 8:
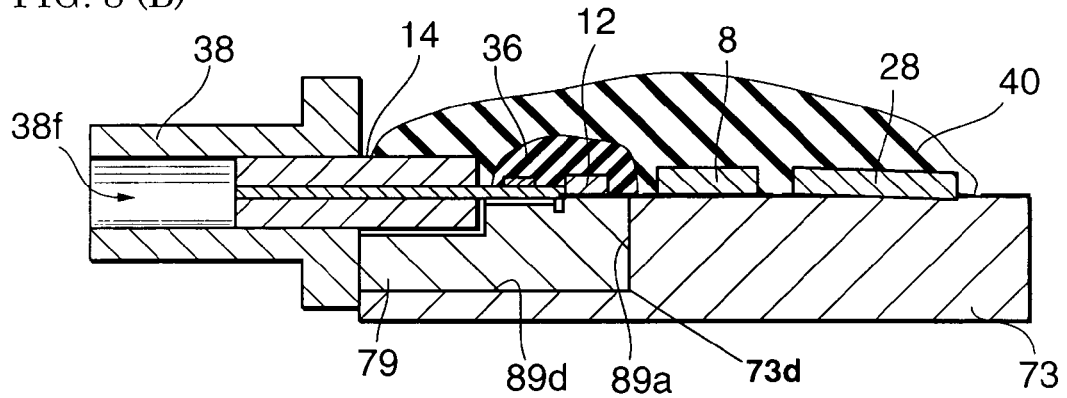
Figure 8:
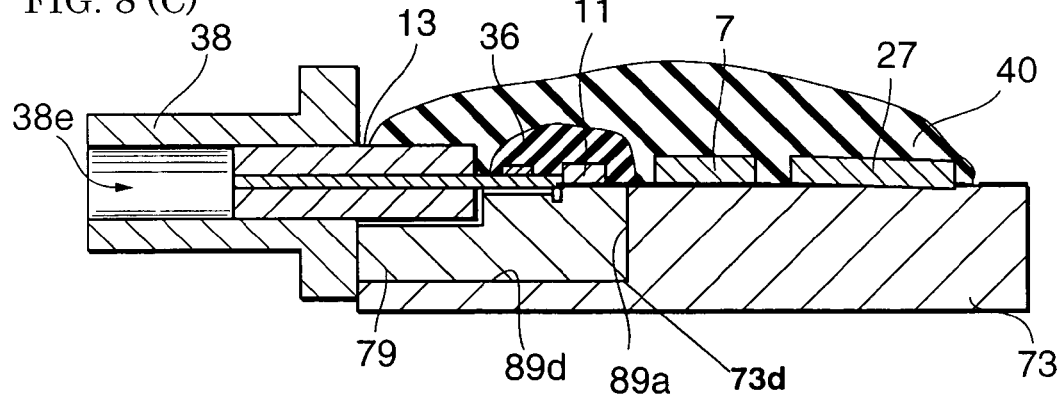

FIG. 7 is a schematic view of an optical data link 2 according to a third embodiment of the present invention. FIG. 8A is a plan view of the optical data link 2 of the third embodiment. FIG. 8B is a cross-sectional view of the optical data link 2, taken along a line V-V in FIG. 8A, and FIG. 8C is a cross-sectional view of the optical data link 2, taken along a line VI-VI in FIG. 8A.

Referring to FIGS. 7, and 8A through 8C, the optical data link 2 includes a circuit board 73 and an optical module component 75. The circuit board 73 has a principal plane 73a, and first and second mounting sections 73b and 73c disposed on the principal plane 73a. The principal plane 73a extends along a first reference plane. A step 73d is formed between the first mounting section 73b and the second mounting section 73c. The first mounting section 73b has the optical module component 75. The second mounting section 73c has electron devices 7 and 8. The optical module component 75 includes a mounting component 79, semiconductor optical device 11 and other semiconductor optical device 22, and optical transmission medium 13 and other optical transmission medium 14. In the optical module component 75, the mounting component 79 has a principal plane 79a, including first to fourth regions 79b to 79e. The first region 79b and the second region 79c are arranged along a first predetermined axis, and the third region 79d and the fourth region 79e are arranged along a second predetermined axis. The first region 79b and the third region 79d are arranged along a third axis orthogonal to the first and second axes, and the second region 79c and the fourth region 79e are arranged along a fourth axis orthogonal to the first and second axes.

The optical data link 2 includes first and second communication units 2a and 2b. In the first communication unit 2a, the semiconductor optical device 11 is electrically connected to the electron device 7, and is mounted on the second region 79c of the mounting component 79. The optical transmission medium 13 is supported by the first region 79b of the mounting component 79, and is optically coupled with the semiconductor optical device 11. In the second communication unit 2b, the other semiconductor optical device 12 is electrically connected to the other electron device 8, and is mounted on the fourth region 79e of the mounting component 79. The optical transmission medium 14 is supported by the third region 79d of the mounting component 79, and is optically coupled with the semiconductor optical device 12.

In the optical data link 2, the optical transmission media 13 and 14 are optically coupled with the semiconductor optical devices 11 and 12 on the mounting component 79, respectively. The semiconductor optical devices 11 and 12 are electrically connected to the electron devices 7 and 8, respectively, via the mounting component 79 and the circuit board 73.

In the optical data link 2, the optical transmission medium 14 includes an optical fiber 16 and a ferrule 18. The optical transmission medium 14 may have a structure similar to the optical transmission medium 13.

The mounting component 79 has third and fourth supporting grooves 20 and 22 for supporting the optical transmission medium 14. The third supporting groove 20 may have a structure similar to the first supporting groove 19. The fourth supporting groove 22 may have a structure similar to the second supporting groove 21. The third supporting groove 20 supports the optical fiber 16, and the fourth supporting groove 22 supports the ferrule 18. In the third embodiment, the optical fiber 16 is fixed to the mounting component 79 using a fixing member 24, and the ferrule 18 is fixed to the mounting component 79 using an adhesive 26. In the optical data link 2, the grooves 19 and 21 and the grooves 20 and 22 in the mounting component 79 are used for positioning of the optical fibers 15 and 16, respectively. For example, the mounting component 79 may be made of a silicon semiconductor.

In the optical data link 2, each of the semiconductor optical devices 11 and 12 may be either a photodiode or a semiconductor laser. More specifically, in the optical data link 2, the semiconductor optical device 11 may be a photodiode, and the semiconductor optical device 12 may be a semiconductor laser. In another example, both the semiconductor optical devices 11 and 12 may be photodiodes. In still another example, both the semiconductor optical devices 11 and 12 may be semiconductor lasers.

The circuit board 73 may further include a third mounting section 73e. In the third embodiment, the first, second, and third mounting sections 73b, 73c, and 73e are arranged in a predetermined axial direction. The optical data link 2 further includes electron devices 27 and 28. The electron device 27, which is provided for the first optical communication unit 2a, is mounted on the third mounting section 73e of the circuit board 73. The electron device 28, which is provided for the second optical communication unit 2b, is mounted on the third mounting section 73e of the circuit board 73.

The circuit board 73 may further include an interface part 73f, which has an electrode or electrodes 32 for connecting the circuit board 73 to an external device(s).

In the optical data link 2, the step 73d is formed between the first mounting section 73b and the second mounting section 73c on the circuit board 73. The first mounting section 73b has a positioning face 89a for positioning the mounting component 79. The first mounting section 73b has guiding faces 89b and 89c for guiding the mounting component 79. As shown in FIGS. 8B and 8C, the first mounting section 73b has a bottom face 89d for supporting the mounting component 79.

The circuit board 73 has conductive patterns 33a, 33b, 34a, and 34b on the principal plane 73a. The conductive patterns 33a and 33b are used for electrical connection between the electron devices 7 and 27, and the conductive patterns 34a and 34b are used for electrical connection between the electron devices 8 and 28. The electron devices 7, 8, 27, and 28 are connected to the conductive patterns 33a, 33b, 34a, and 34b via a connector such as a bonding wire. The semiconductor optical devices 11 and 12 are electrically connected to the electron devices 7 and 8 via connectors such as bonding wires, respectively.

The optical data link 2 may further include a transparent resin 36. The transparent resin 36 is formed so as to cover the optical path from either one of the semiconductor optical device 11 and the optical transmission medium 13 to the other and the optical path from either one of the semiconductor optical device 12 and the optical transmission medium 14 to the other. The light propagating through the optical transmission media 13 and 14 is allowed to pass through the transparent resin 36.

In the optical data link 2, the principal plane 79a of the mounting component 79 and the principal plane 73a of the circuit board 73 may extend along a common reference plane. With such structure of the optical data link 2, the electrical wiring length between the semiconductor optical devices 11 and 12 and the circuit board 73 can be reduced.

The optical data link 2 may further include a receptacle member 38 having a receptacle structure. The receptacle member 38 has a receptacle structure. The receptacle member 38 is attached to at least one of the optical module component 75 and the mounting component 79. Receptacle holes 38e and 38f receive in part portions of the ferrules 17 and 18, respectively.

As shown in FIG. 8A, the optical data link 2 may further include a sealing resin 40 with which the transparent resin 36, the semiconductor optical devices 11 and 12, and the electron devices 7, 8, 27, and 28 are covered. The sealing resin 40 protects the semiconductor optical devices 11 and 12 and the electron devices 7, 8, 27, and 28 from contamination. The sealing resin 40 is preferably colored in order to block the light from reaching the electron devices 7, 8, 27, and 28 and the semiconductor optical devices 11 and 12.

As described above, in the optical data link 2 of the third embodiment, the optical module component 75 includes optical coupling between the optical transmission media 13 and 14 and the semiconductor optical devices 11 and 12 using the mounting component 79, and the optical module component 75 is mounted on the circuit board 73. Therefore, the optical data link 2 requires fewer component parts.

The optical data link 2 of the third embodiment may have a structure similar to the optical data link 1b of the second embodiment.

Fourth Embodiment

Figure 9:
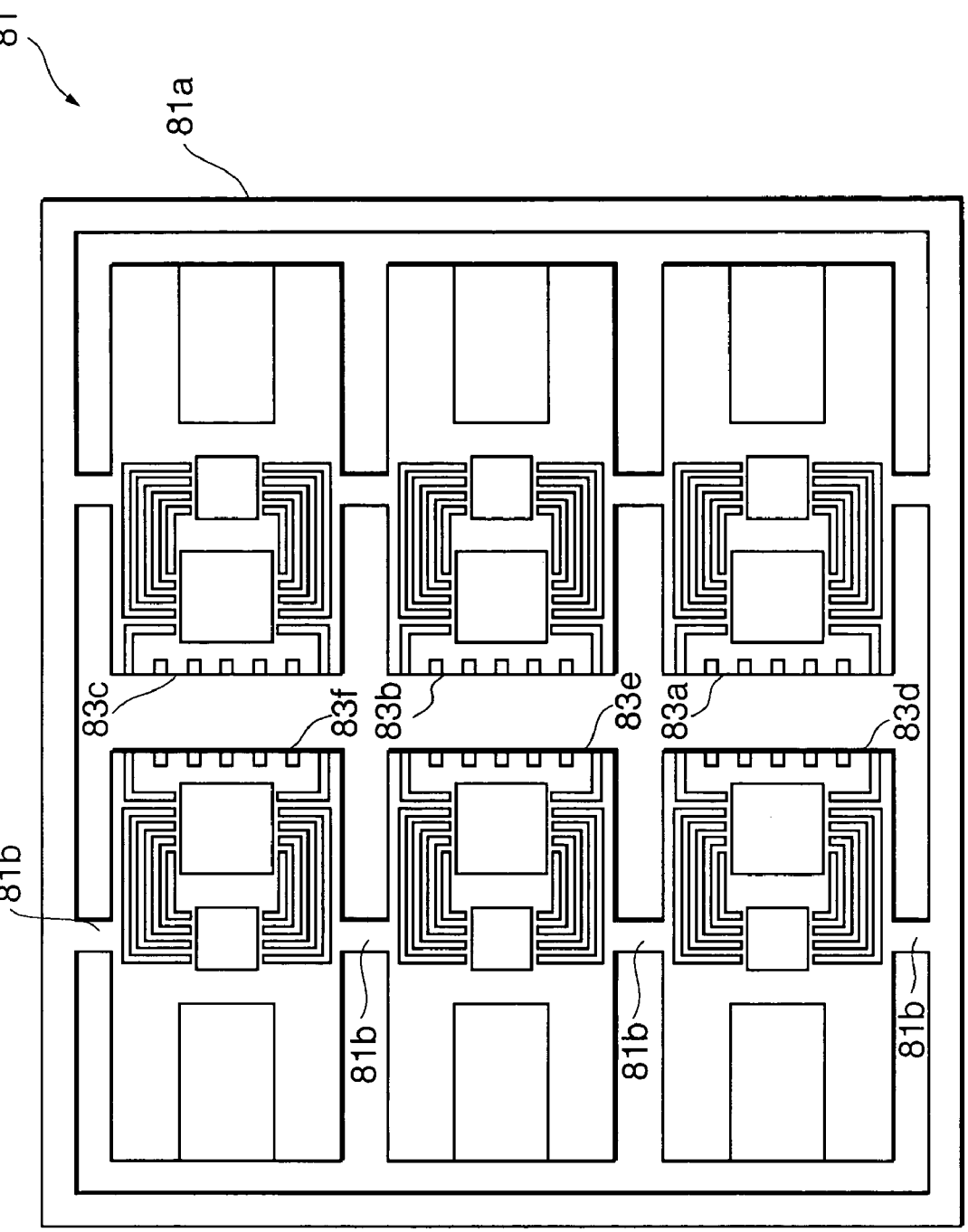
FIG. 9A is a schematic view of a circuit board component.
FIG. 9B is a schematic view for showing the assembly of an optical module component.
Figure 9:
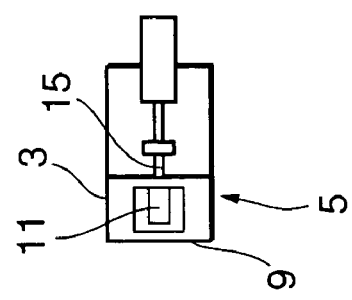

FIGS. 9A, 9B, and 10 through 12 are diagrams for showing a method of manufacturing an optical data link. A circuit board component 81 shown in FIG. 9A is provided. The circuit board component 81 includes a frame 81a, a plurality of circuit boards 83a to 83f, and tie bars 81b. The circuit boards 83a to 83f are arranged into an array. The tie bars 81b connect the circuit boards 83a to 83f to the frame 81a. Each of the circuit boards 83a to 83f may have a structure similar to the circuit board 3 shown in FIG. 2.

Then, an optical module component 5 is assembled as shown in FIG. 9B. The optical module component 5 is constructed by positioning the optical fiber 15 and the semiconductor optical device 11 so that the axes of the optical fiber 15 and the semiconductor optical device 11 on the mounting component 9 are optically aligned. Preferably, the optical module components 5 are checked one-by-one to remove defective components.

Figure 10:
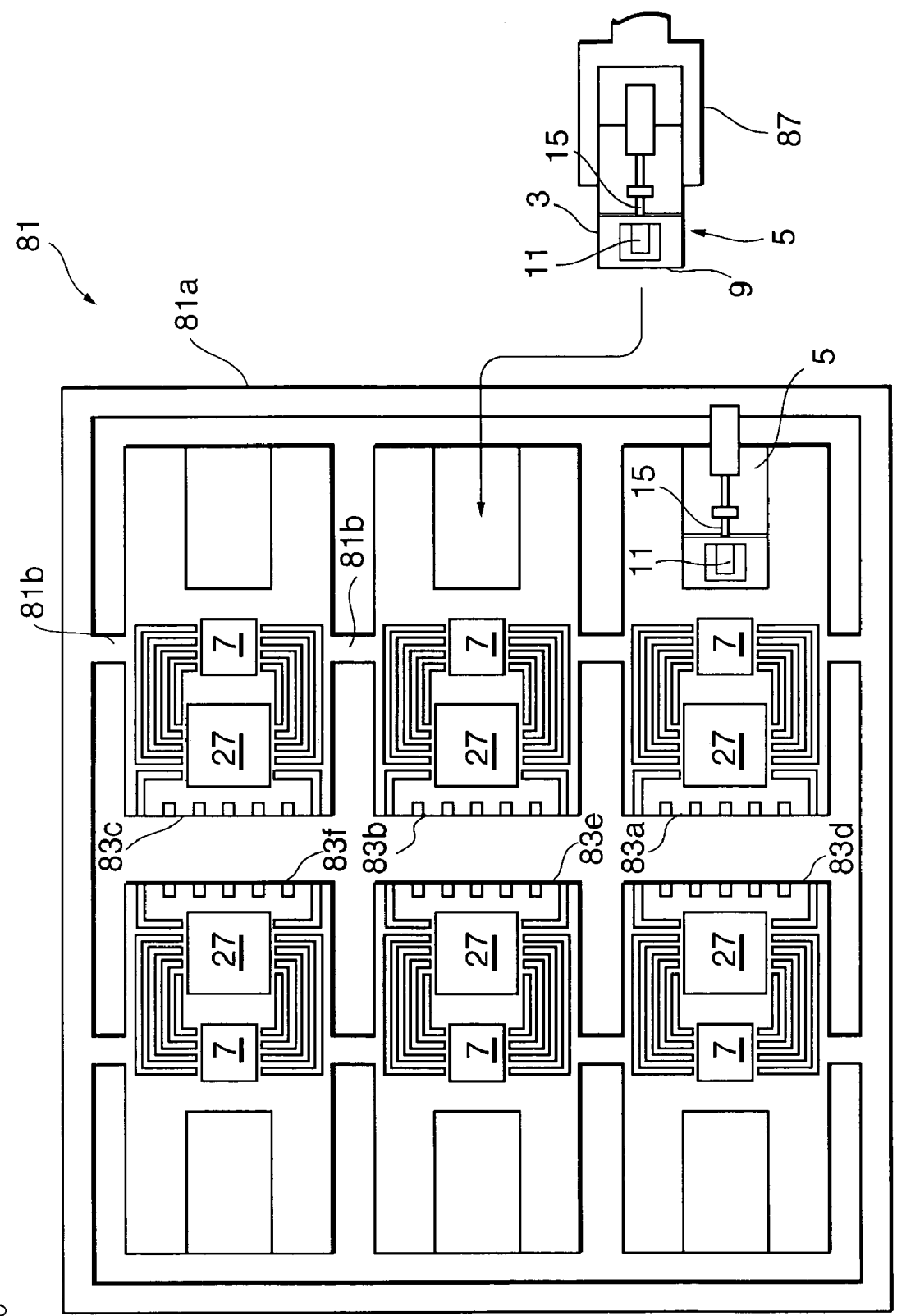
FIG. 10 is a diagram for showing a method of manufacturing an optical data link.

Then, the electron devices 7 and 27 and the optical module component 5 are mounted onto the respective circuit boards 83a to 83f. FIG. 10 illustrates a status in which an optical module component 5 is already mounted on the circuit board 83a and another optical module component 5 is also being mounted onto the circuit board 83b using a handler 87. Preferably, a multi-handler is used to mount the electron devices 7 and 27 and the optical module component 5.

Figure 11:
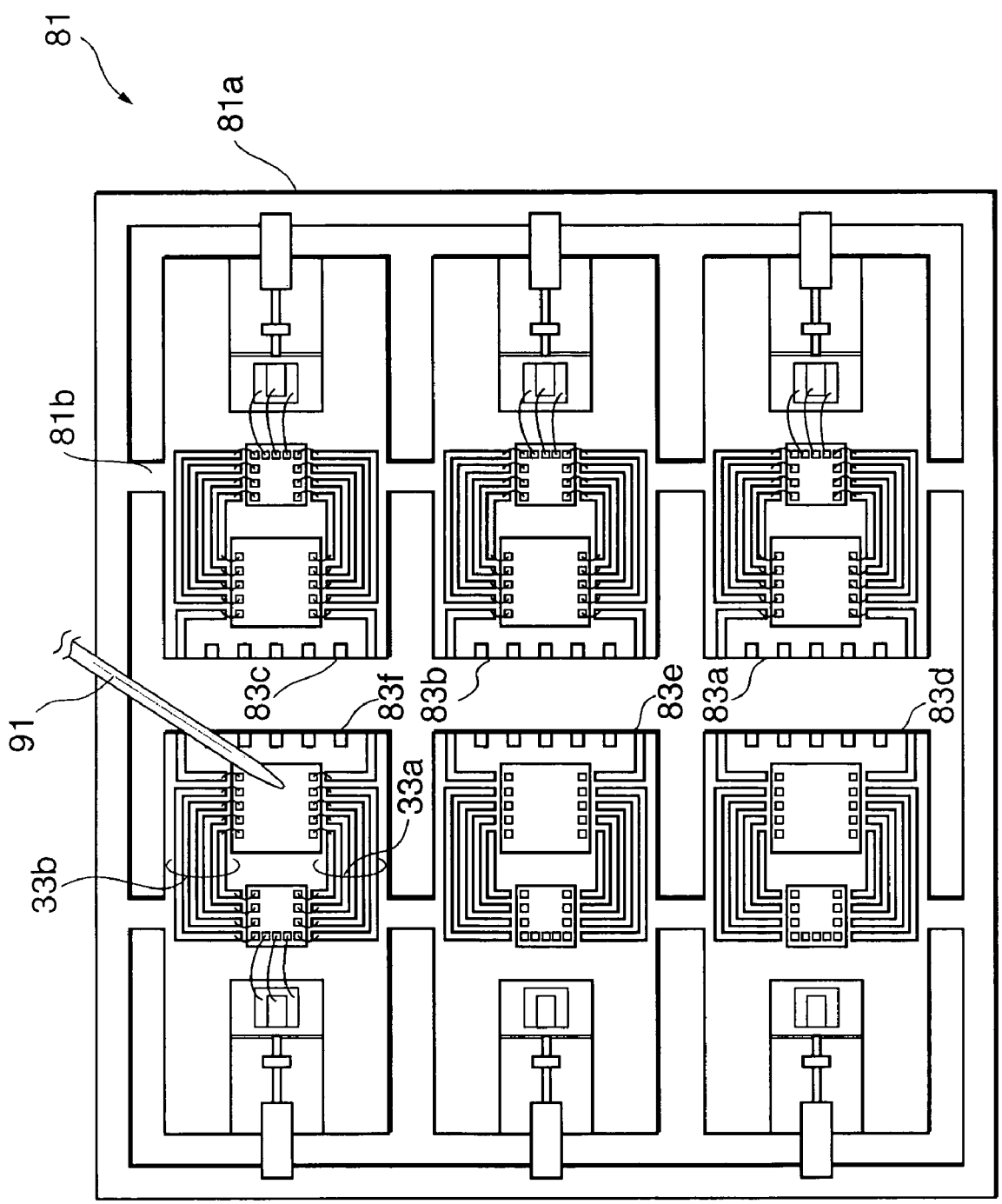
FIG. 11 is a diagram for showing the method of manufacturing an optical data link.

Then, the optical module component 5 and the electron devices 7 and 27 are connected to the conductive patterns 33a and 33b on the respective circuit boards 83a to 83f. FIG. 11 shows a state in which the connection work is being done on the circuit board 83f. In the fourth embodiment, a bonding device 91 is used to connect the optical module component 5 and the electron devices 7 and 27 to the conductive patterns 33a and 33b on the circuit board 83f via bonding wires.

According to this method and the optical data link, optical axial alignment between the optical fiber 15 and the semiconductor optical device 11 can be implemented by means of using the mounting component 9. Subsequently, after the optical module component 5 and the electron devices 7 and 27 are mounted on the respective circuit boards 83a to 83f, each semiconductor optical device 11 can be electrically connected to the respective electron device 7.

After the completion of the connection work, the transparent resin 35 is formed so as to cover the optical fiber 15 and the semiconductor optical device 11. The sealing resin 39 is further formed so as to cover the transparent resin 35, the electron devices 7 and 27, and the bonding wires.

Figure 12:
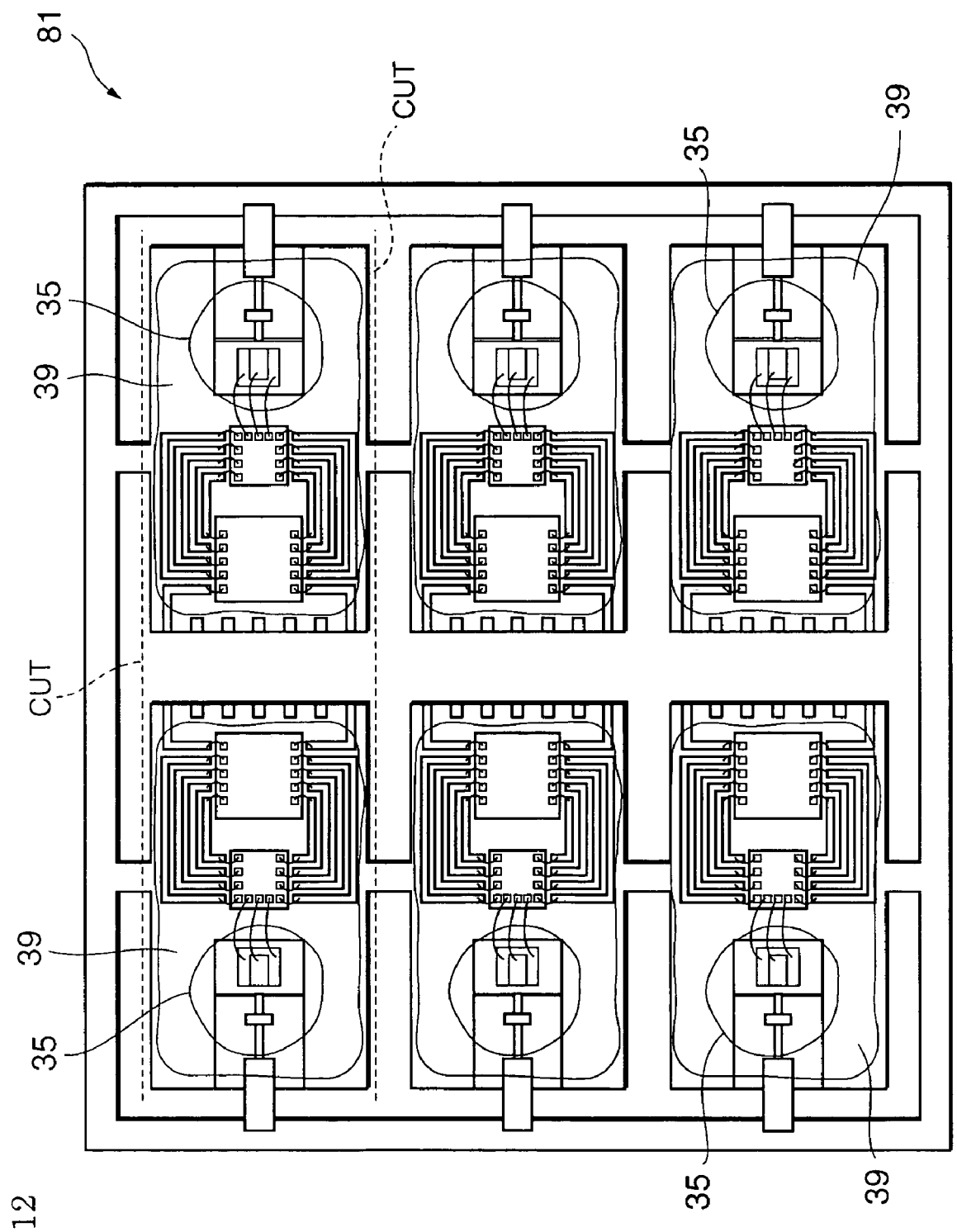
FIG. 12 is a diagram for showing the method of manufacturing an optical data link.

After forming the sealing resin 39, the tie bars 81b are cut along broken lines CUT shown in FIG. 12 to produce discrete optical data links.

According to the present method, an optical module component can also be mounted onto each circuit board in the process of mounting electron devices onto the circuit board. Since no package is required for the optical module component, the process for packaging is eliminated. With a structure where the optical module component is mounted onto a concave portion in each circuit board, the electrical wiring length between the semiconductor optical device and the circuit board can be reduced. The optical module component can be inspected before being mounted onto each circuit board.

As described above, according to the fourth embodiment, in the optical data link, the optical module component includes optical coupling between the optical transmission medium and the semiconductor optical device using the mounting component, and the optical module component is mounted onto each circuit board. Therefore, an optical data link having fewer component parts is produced.

The principle of the present invention has been described in the context of the preferred embodiments. It is to be appreciated by those skilled in the art that a variety of modifications may be made to the arrangement and the details of the present invention without departing from the principle of the invention. The present invention is not limited to the specific configuration shown in the foregoing embodiments. For example, while the embodiments using a card-edge type circuit board have been described, a circuit board having lead terminals may be used in place of a card-edge type circuit board. The base material of the circuit board may be resin or ceramic. Accordingly, the present invention may embrace all variations and modifications that fall within the scope and spirit of the invention set forth in the appended claims.

What is claimed is:

1. An optical data link comprising:
   a circuit board having first and second mounting sections on a principal plane thereof;

an optical module component mounted on the first mounting section of the circuit board; and
an electronic device mounted on the second mounting section of the circuit board, wherein the electronic device comprises an amplifier or a driver,
a concave portion in the first mounting section of the circuit board to receive the optical module component,
wherein the optical module component comprises:
  a mounting component having a principal plane including first and second regions;
  a semiconductor optical device mounted on the first region of the mounting component adjacent to the amplifier or driver and electrically connected directly to the amplifier or driver; and
  an optical transmission medium supported by the second region of the mounting component and optically coupled with the semiconductor optical device;
wherein:
the optical transmission medium comprises an optical fiber and a ferrule,
the optical fiber has first and second portions,
the second portion of the optical fiber is retained in the ferrule,
the optical data link further comprises a transparent resin on an optical path from one of either the semiconductor optical device and the optical transmission medium to the other, and
the optical data link is operable so that light propagating through the optical transmission medium passes through the transparent resin.

2. An optical data link according to claim 1, wherein the mounting component has a first supporting groove for supporting the first portion of the optical fiber, and a second supporting groove for supporting the ferrule, and
  the optical fiber is positioned on the mounting component so as to be optically coupled with the semiconductor optical device.

3. An optical data link according to claim 1, wherein the mounting component has a supporting groove for supporting the first portion of the optical fiber;
  the circuit board has a supporting groove for supporting the ferrule; and
  the optical fiber is positioned on the mounting component so as to be optically coupled with the semiconductor optical device.

4. An optical data link according to claim 1, wherein the semiconductor optical device is a photodiode or a semiconductor laser.

5. An optical data link according to claim 1, further comprising:
  a second semiconductor optical device mounted on the first region of the mounting component;
  a second optical transmission medium mounted on the second region of the mounting component and optically coupled with the second semiconductor optical device; and
  a second electronic device mounted on the circuit board, wherein the second semiconductor optical device is mounted adjacent to and electrically connected directly to an amplifier or driver of the second electronic device.

6. An optical data link according to claim 2, further comprising:
  a second semiconductor optical device mounted on the first region of the mounting component;
  a second optical transmission medium mounted on the second region of the mounting component and optically coupled with the second semiconductor optical device; and
  a second electronic device mounted on the circuit board, wherein the second semiconductor optical device is mounted adjacent to and electrically connected directly to an amplifier or driver of the second electronic device.

7. An optical data link according to claim 3, further comprising:
  a second semiconductor optical device mounted on the first region of the mounting component;
  a second optical transmission medium mounted on the second region of the mounting component and optically coupled with the second semiconductor optical device; and
  a second electronic device mounted on the circuit board, wherein the second semiconductor optical device is mounted adjacent to and electrically connected directly to an amplifier or driver of the second electronic device.

8. An optical data link according to claim 4, further comprising:
  a second semiconductor optical device mounted on the first region of the mounting component;
  a second optical transmission medium mounted on the second region of the mounting component and optically coupled with the second semiconductor optical device; and
  a second electronic device mounted on the circuit board, wherein the second semiconductor optical device is mounted adjacent to and electrically connected directly to an amplifier or driver of the second electronic device.

9. An optical data link according to claim 1, further comprising: a receptacle member having a receptacle structure, wherein the receptacle member is attached to at least one of either the optical module component and the mounting component.

10. An optical data link according to claim 5, further comprising:
  a receptacle member having a receptacle structure,
  wherein the receptacle member is attached to at least one of either the optical module component and the mounting component.

11. An optical data link according to claim 1, wherein the principal plane of the mounting component and the principal plane of the circuit board extend along a predetermined reference plane.

12. An optical data link according to claim 5, wherein the principal plane of the mounting component and the principal plane of the circuit board extend along a predetermined reference plane.

* * * * *